(12) United States Patent
Furuta et al.

(10) Patent No.: US 8,148,814 B2
(45) Date of Patent: Apr. 3, 2012

(54) SEMICONDUCTOR INTEGRATED CIRCUIT DEVICE COMPRISING A PLURALITY OF SEMICONDUCTOR CHIPS MOUNTED TO STACK FOR TRANSMITTING A SIGNAL BETWEEN THE SEMICONDUCTOR CHIPS

(75) Inventors: Futoshi Furuta, Kokubunji (JP); Kenichi Osada, Tokyo (JP); Makoto Saen, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 244 days.

(21) Appl. No.: 12/699,006

(22) Filed: Feb. 2, 2010

(65) Prior Publication Data
US 2010/0200998 A1   Aug. 12, 2010

(30) Foreign Application Priority Data
Feb. 10, 2009   (JP) .................. 2009-028037

(51) Int. Cl.
*H01L 23/34*   (2006.01)
(52) U.S. Cl. .. 257/723; 257/724; 257/725; 257/E23.085
(58) Field of Classification Search .................. 257/723, 257/724, 725, E23.085
See application file for complete search history.

(56) References Cited

U.S. PATENT DOCUMENTS

| 7,990,171 | B2 * | 8/2011 | Chung et al. | ............ 324/762.01 |
| 2007/0005876 | A1 | 1/2007 | Ikeda et al. | |
| 2009/0091333 | A1 * | 4/2009 | Chung et al. | ................... 324/538 |
| 2011/0248740 | A1 * | 10/2011 | Chung et al. | ............ 324/762.01 |

FOREIGN PATENT DOCUMENTS
JP   2006-330974 A   12/2006

OTHER PUBLICATIONS

Kenji Takahashi et al., "Current Status of Research and Development for Three-Dimensional Chip Stack Technology", Japanese Journal of Applied Physics, vol. 40 (2001) pp. 3032-3037.

* cited by examiner

*Primary Examiner* — Ngan Ngo
(74) *Attorney, Agent, or Firm* — Miles & Stockbridge P.C.

(57) ABSTRACT

In a through-via-hole path of semiconductor chips stacked in N stages, repeater circuits are provided in the respective semiconductor chips. For example, a signal transmitted from an output buffer circuit of the semiconductor chip is transmitted to an input buffer circuit of the semiconductor chip via the repeater circuits of the respective semiconductor chips. The respective repeater circuits can isolate impedances on input sides and output sides, and therefore, a deterioration of a waveform quality accompanied by a parasitic capacitance parasitic on the through-via-hole path of the respective semiconductor chips can be reduced and a high speed signal can be transmitted.

18 Claims, 12 Drawing Sheets

107: OUTPUT BUFFER CIRCUIT
108: INPUT BUFFER CIRCUIT
300: SEMICONDUCTOR CHIP
301: REPEATER CIRCUIT

SEMICONDUCTOR INTEGRATED CIRCUIT DEVICE COMPRISING A PLURALITY OF SEMICONDUCTOR CHIPS MOUNTED TO STACK FOR TRANSMITTING A SIGNAL BETWEEN THE SEMICONDUCTOR CHIPS

CLAIM OF PRIORITY

The present application claims priority from Japanese patent application JP 2009-028037 filed on Feb. 10, 2009, the content of which is hereby incorporated by reference into this application.

FIELD OF THE INVENTION

The present invention relates to a semiconductor integrated circuit device. Particularly, in a semiconductor integrated circuit device stacking to mount semiconductor chips integrated with microprocessors, memories etc., the invention relates to a signal transmitting method among the respective semiconductor chips.

BACKGROUND OF THE INVENTION

For example, a significant characteristic of a CMOS (Complementary Metal Oxide Semiconductor) circuit resides in a scaling rule that when an element size is miniaturized, an increase in an operational speed and a reduction in power consumption can be realized. Heretofore, a degree of integration per chip and performance have been promoted by miniaturization of the element. However, with a progress in miniaturization, the promotion of the degree of integration and the chip performance tend to slow down. The reason is that there is a limit in the miniaturization per se, a delay in wirings among elements is actualized by an increase in the speed of the element, and the reduction in power consumption becomes difficult by a problem of leakage by miniaturizing the element.

On the other hand, when an information processing system of a constant scale is constructed, there is a limit in a function of enabling integration on one chip, and therefore, it is indispensable to arrange plural chips and connect the chips. Heretofore, a direction of arranging chips is horizontal, and a distance of transmitting signals among chips becomes a length equal to or larger than one side length of the chip. Therefore, even when the operational speed per chip is increased by miniaturization, time is still taken in transmission among chips, and therefore, an increase in a speed of a system as a whole is difficult.

In order to deal with slow down in promotion of the chip function and promotion of function of the system as a whole, there is proposed a stacked chip system represented by Takahashi, eight others: Current Status of Research and Development for Three-Dimensional Chip Stack Technology, JAPANESE JOURNAL OF APPLIED PHYSICS, Vol. 40, 2001, pp. 3032-3037. The outline is shown in FIG. 1A. This is a technology of transmitting information or power by three-dimensionally stacking other circuit chips upward and downward from a semiconductor chip 100 and connecting the chips by a through-via-hole. It can be expected that a delay by wirings among elements in the chip and a delay by transmission among chips which becomes a bottleneck in a total of the system is considerably reduced by transmitting a signal in a long distance wiring of the chip or a wiring among chips by a through-via-hole right above the chip.

The through-via-hole used here is constituted by a structure of penetrating head and tail of a chip literally by a penetrated conductor 101. The penetrated conductor 101 is brought into contact with a pad 102 in a circuit forming layer 111, and the pad 102 is brought into contact with a penetrated conductor of another chip via a solder bump 104. The chip at the lowest layer is brought into contact with a package board 112 etc. via the solder bump 104. An insulating film 103 is formed at a surrounding of the penetrated conductor 101. A semiconductor substrate layer 110 constituting the chip is substantially at the ground potential, and therefore, it is necessary to insulate a portion at which the penetrated conductor and the semiconductor substrate layer 110 are brought into contact with each other.

Further, for example, JP-A-2006-330974 discloses a technology of realizing high speed data transmission by inserting a latch circuit at a data signal path of a through-via-hole, making a total of a stacked layer system carry out a pipeline operation, and isolating a parasitic capacitance by the latch circuit.

SUMMARY OF THE INVENTION

However, in the through-via-hole as shown in FIG. 1A described above, the parasitic capacitance of an area of about via hole circumference×chip thickness and a distance between electrodes of about a thickness of the insulating film is formed per piece thereof. FIG. 1B shows an equivalent circuit of a peripheral portion of the through-via-hole per chip. When a high speed signal is transmitted to a multilayers-stacked chip by using the through-via-hole, a through-via-hole parasitic capacitance 106 is added, and therefore, an influence of the parasitic capacitance becomes considerable. When a voltage of a transmitted signal rises, the signal is delayed by a time period of charging the parasitic capacitance. A similar delay is caused also when the signal falls. Therefore, an upper limit of a frequency of a high speed signal, for example, a clock signal in a rectangular wave shape is restricted.

Hence, for example, as shown by JP-A-2006-330974, a system of inserting the latch circuit in the data signal path of the through-via-hole, and making the total of the laminated layer system carry out the pipeline operation is conceivable. The system is suitable for a stacked chip having a single function as in a stacked layer memory chip system. However, when the data signal path is made to carry out the pipeline operation by using the latch circuit, although there is room for considerably improving a throughput of data transmission (that is, clock period), delay time (latency) is increased by clock period×stacked layer number, and therefore, the delay time is actualized as a big problem of latency particularly in stacking a CPU memory chip and a memory chip. Furthermore, in JP-A-2006-330974, the clock signal still uses the through-via-hole of the background art, and therefore, actually, it is difficult to transmit high speed clock signal and the improvement in the through put described above can be limited.

Furthermore, addition of the parasitic capacitance effects a significant influence not only on the speed but the power consumption. When the through-via-hole is used as a common bus in a stacked layer chip system composed of plural memory chips and plural CPU chips, there is a concern that particularly, the larger the stacked layer number, the more increased the power consumption, and it is preferable to reduce charging and discharging currents as less as possible even in the common bus (through-via-hole). In addition, when plural chips are stacked, a circuit constitution of interface differs for the respective chips. Although the circuit constitution is changed for the respective chips in the background art, a number of masks is increased, a kind of the chip formed is increased, and therefore, the circuit constitution is disadvantageous in view of design and fabrication cost.

The invention has been carried out in view thereof, and an object described above and other object and a novel characteristic of the invention will become apparent by a description of the specification and attached drawings.

A brief description is given to an outline of a representative embodiment of the invention disclosed in the application as follows.

The semiconductor integrated circuit device according to the embodiment is constituted by plural semiconductor chips stacked to be mounted to each other and connected by a through-via-hole. FIG. 2A shows a representative structure example of the respective semiconductor chips, and FIG. 2B shows an equivalent circuit which becomes an example of FIG. 2A. In a through-via-hole path of FIG. 2A, the pad 102 formed at the circuit forming layer 111 of a semiconductor chip 200 and the penetrated conductor 101 formed at the semiconductor substrate layer 110 are not directly connected electrically but are connected via a transistor (here, MOS transistor) 210. In an example of FIG. 2A, the pad 102 is connected to a gate node 202a of the MOS transistor via a metal wiring layer or the like formed at the circuit forming layer 111, and is connected to the penetrated conductor 101 from one node 202b of a source and a drain via a metal wiring layer or the like.

In FIG. 2B, the MOS transistor 210 of FIG. 2A is used as a portion of a repeater circuit (impedance converting circuit) 201. In respective semiconductor chips stacked to each other, by providing the repeater circuit 201, the parasitic capacitance 106 at the through-via-hole path can be partitioned for respective chips, and high speed communication among chips can be realized. The repeater circuit 201 is constituted by a unidirectional buffer circuit or a bidirectional buffer circuit in accordance with a specification of the transmitting direction. The unidirectional or bidirectional buffer circuit may preferably be constituted by a tristate buffer circuit. Thereby, a specific buffer circuit can be set to a high impedance state, for example, in the through-via-hole path, a portion of the path which is not used in a certain period of time can be divided, and wasteful power consumption in accordance with charging and discharging can be reduced. Incidentally, in FIG. 2B, the pad 102 is also connected with an input buffer circuit 108 for receiving a signal to a predetermined inner core circuit and an output buffer circuit 107 for transmitting a signal from the inner core circuit.

Further, in addition to the repeater circuit 201, there may be provided a bypass switch of bypassing through the repeater circuit 201 to constitute to be able to arbitrarily select whether the repeater circuit is passed or bypassed through without passing the circuit for respective chips. This is useful, for example, when delay time of the repeater circuit 201 is intended to shorten. When the bypass switch is constituted by, for example, a CMOS switch or the like, a connecting relationship of the MOS transistor differs from that of FIG. 2A, the penetrated conductor 101 is connected to one node of the source and the drain, and the pad 102 is connected to other node of the source and the drain. Further, it is preferable to constitute to be able to arbitrarily select a state of the repeater circuit 201 and the bypass switch (that is, transmitting direction of the repeater circuit, bypass, high impedance state) by an external signal etc. Thereby, for example, a communicating condition can be set to be optimum pertinently in accordance with an application executed by the semiconductor integrated circuit device.

Briefly describing advantage provided by the representative embodiment of the invention disclosed in the application, high speed communication among chips can be realized in the semiconductor integrated circuit device having the through-via-hole and being composed of semiconductor chips stacked to each other.

DETAILED DESCRIPTION OF THE PREFERRED EMBODIMENTS

Although in the following embodiments, when needed for convenience, a description will be given by dividing into plural sections or embodiments, except a case of clearly showing particularly, these are not unrelated to each other but one of them is brought into a relationship of a portion or a total of modified example, details, supplemental description etc. of other. Further, in the following embodiments, when a number of elements etc. (including number of piece, numerical value, amount, range etc.) is referred to, except a case of clearly showing particularly, a case of limiting to a specific number clearly in principle, the embodiments are not limited to the specific number but may be equal to or larger than or equal to or smaller than the specific number.

Furthermore, in the following embodiments, constituent elements (including elements, steps) are not naturally necessarily indispensable except a case of particularly clearly showing and a case conceived to be clearly indispensable in principle. Similarly, in the following embodiments, when shapes, positional relationships etc. of constituent elements etc. are referred, those approximated or resembled in shapes etc. substantially are included except a case of particularly clearly showing and a case conceived not to be clearly so in principle. The same goes with the numerical value and the range described above.

A detailed description will be given of embodiments of the invention as follows based on the drawings. Further, in all the drawings for explaining embodiments, the same members are attached with the same notations as a rule and a repeated description thereof will be omitted.

First Embodiment

Figure 1A:
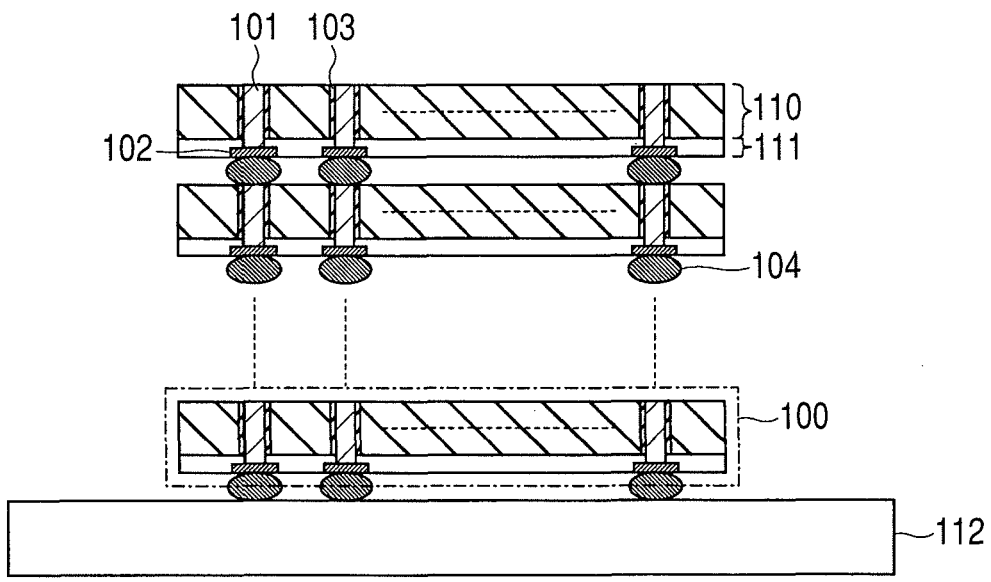
FIG. 1A is a sectional view showing an example of a general stacked chip system and FIG. 1B is an equivalent circuit diagram at a surrounding of one piece of a through-via-hole path of FIG. 1A.
Figure 1B:
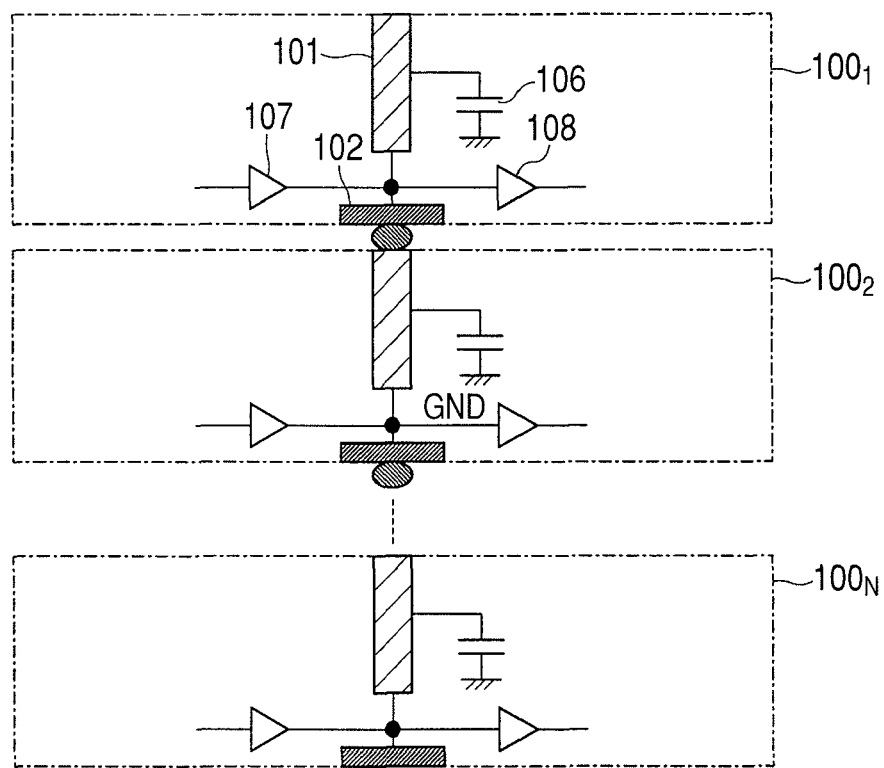
Figure 2A:
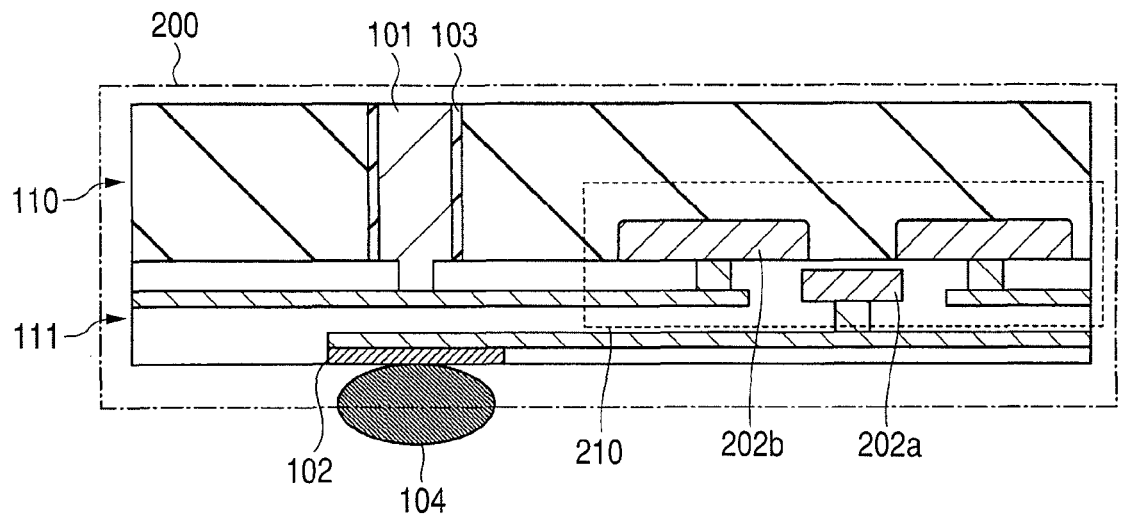
FIG. 2A is a sectional view of a semiconductor integrated circuit device according to a representative embodiment of the invention showing an example of a structure of an essential portion at a surrounding of a through-via-hole of each semiconductor chip thereof.
Figure 2B:
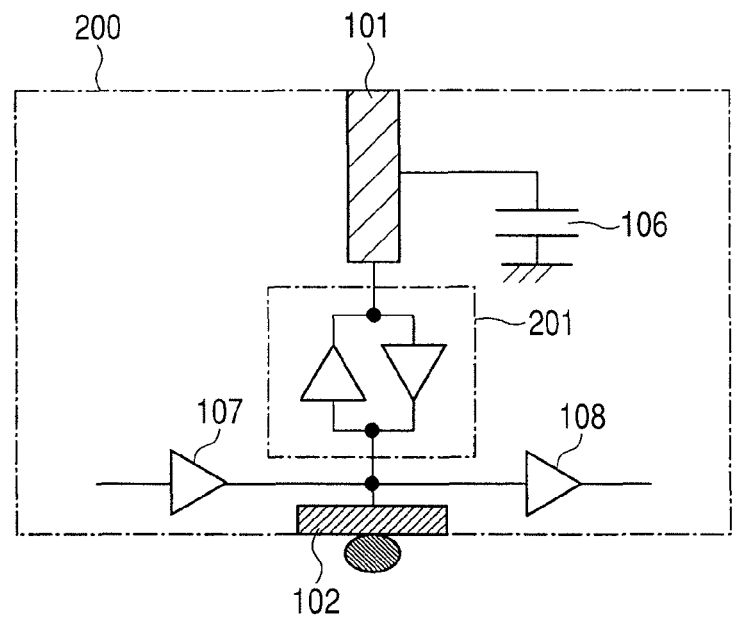
FIG. 2B is an equivalent circuit diagram of FIG. 1A.
Figure 3A:
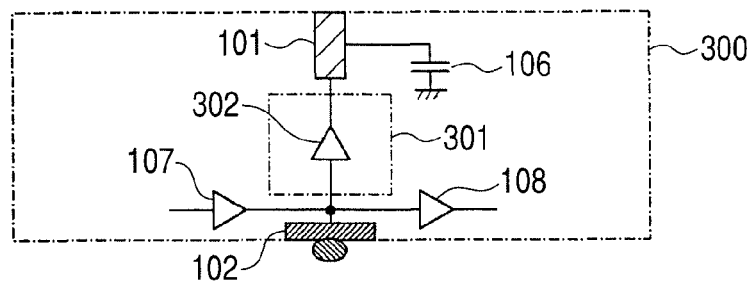
FIG. 3A is an equivalent circuit diagram of a semiconductor integrated circuit device according to a first embodiment of the invention showing an outline constitution example of an essential portion per one semiconductor chip thereof.
Figure 3B:
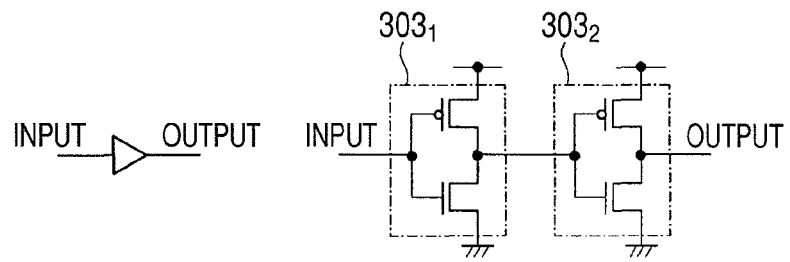
FIG. 3B is an equivalent circuit diagram showing a detailed constitution example of a repeater circuit in FIG. 3A.
Figure 3C:
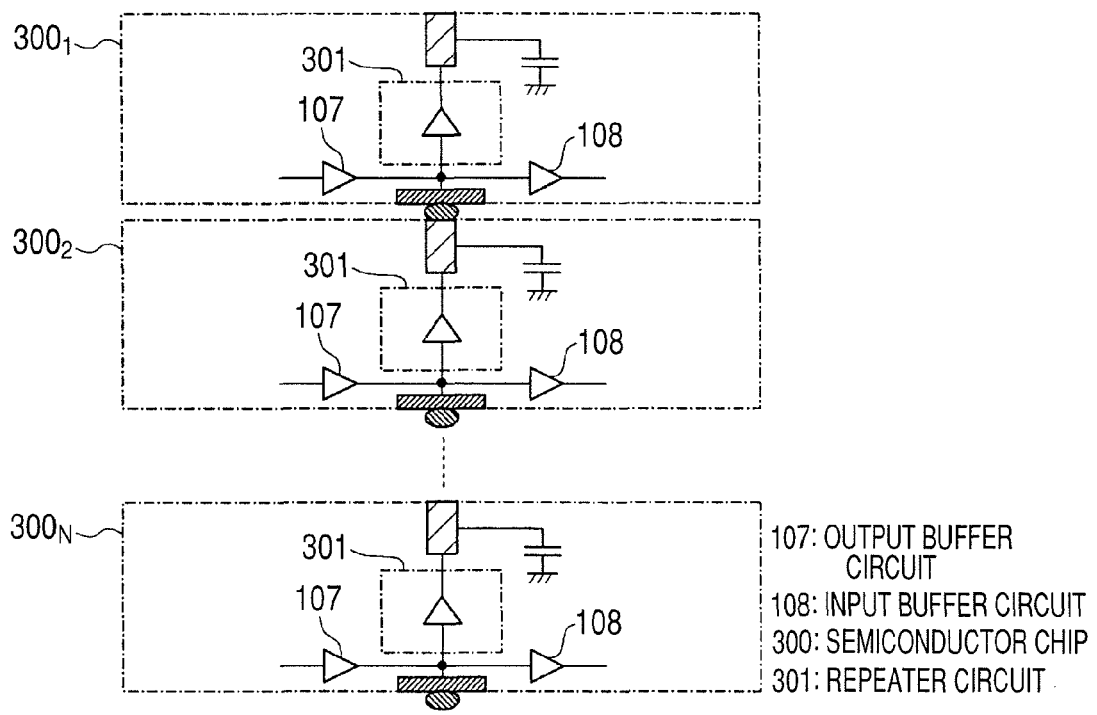
FIG. 3C is an equivalent, circuit diagram showing a through-via-hole path when the semiconductor chips of FIG. 3A are mounted to stack.

FIG. 3A is an equivalent circuit diagram of a semiconductor integrated circuit device according to a first embodiment of the invention showing an outline constitution example of an essential portion per one semiconductor chip 300 thereof, FIG. 3B is an equivalent circuit diagram showing a detailed constitution example of a repeater circuit in FIG. 3A, and FIG. 3C is an equivalent circuit diagram showing a through-via-hole path when the semiconductor chips 300 of FIG. 3A are mounted to stack. As shown by FIG. 3A, the semiconductor integrated circuit device of the first embodiment is essentially characterized in using a unidirectional buffer circuit 302 as a repeater circuit 301. In FIG. 3A, the pad 102 is connected to an input terminal of the buffer circuit 302 and the penetrated conductor 101 is connected to an output terminal of the buffer circuit 302. Therefore, a signal is propagated from the downward pad 102 to the upward penetrated conductor 101.

The repeater circuit 301 (buffer circuit 302) is an impedance converting circuit, and an output impedance of the buffer circuit 302 does not depend on the impedance of the circuit connected to the input side. Therefore, in the through-via-hole circuit connected vertically, the parasitic capacitance 106 of the through-via-hole can be isolated chip by chip by inserting the repeater circuit 301 for each semiconductor chip 300. Thereby, an influence of the parasitic capacitance in the transmission path using the through-via-hole is reduced, and therefore, a high speed signal can be transmitted in a state of maintaining a waveform quality, as a result, high speed communication can be carried out among the semiconductor chips.

As shown by FIG. 3B, the unidirectional buffer circuit 302 is realized by, for example, CMOS inverter circuits $303_1$, $303_2$ etc. of 2 stage connection. The output impedance of the buffer circuit 302 is determined by a resistance component of FET constituting the inverter $303_2$ at a second stage and parasitic capacitance, and therefore, the output impedance does not depend on the input side of the buffer circuit 302. As a result, the influence of the parasitic capacitance 106 of the through-via-hole connected to the input side can be divided by the buffer circuit 302. Further, the constitution is applied when communication by way of the through-via-hole is carried out in a transmitting direction directed from a semiconductor chip $300_N$ at a lowest layer to a semiconductor chip $300_1$ at a highest layer in FIG. 3C.

As described above, by using the semiconductor integrated circuit device according to the first embodiment of the invention, representatively, high speed communication can be realized among semiconductor chips.

Second Embodiment

Figure 4A:
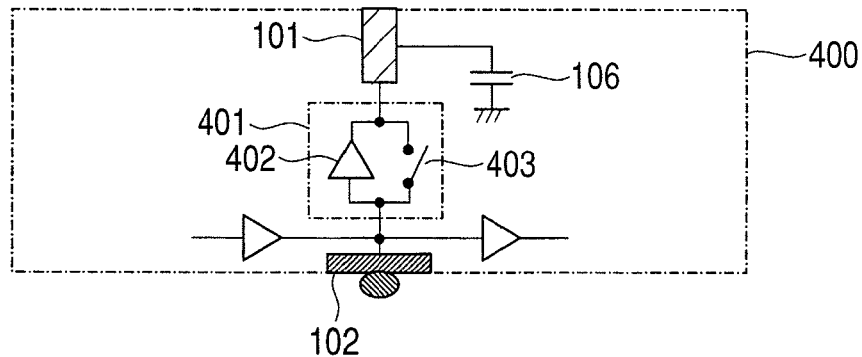
FIG. 4A is an equivalent circuit diagram of a semiconductor integrated circuit device according to a second embodiment of the invention showing an outline constitution example of an essential portion per one semiconductor chip.
Figure 4B:
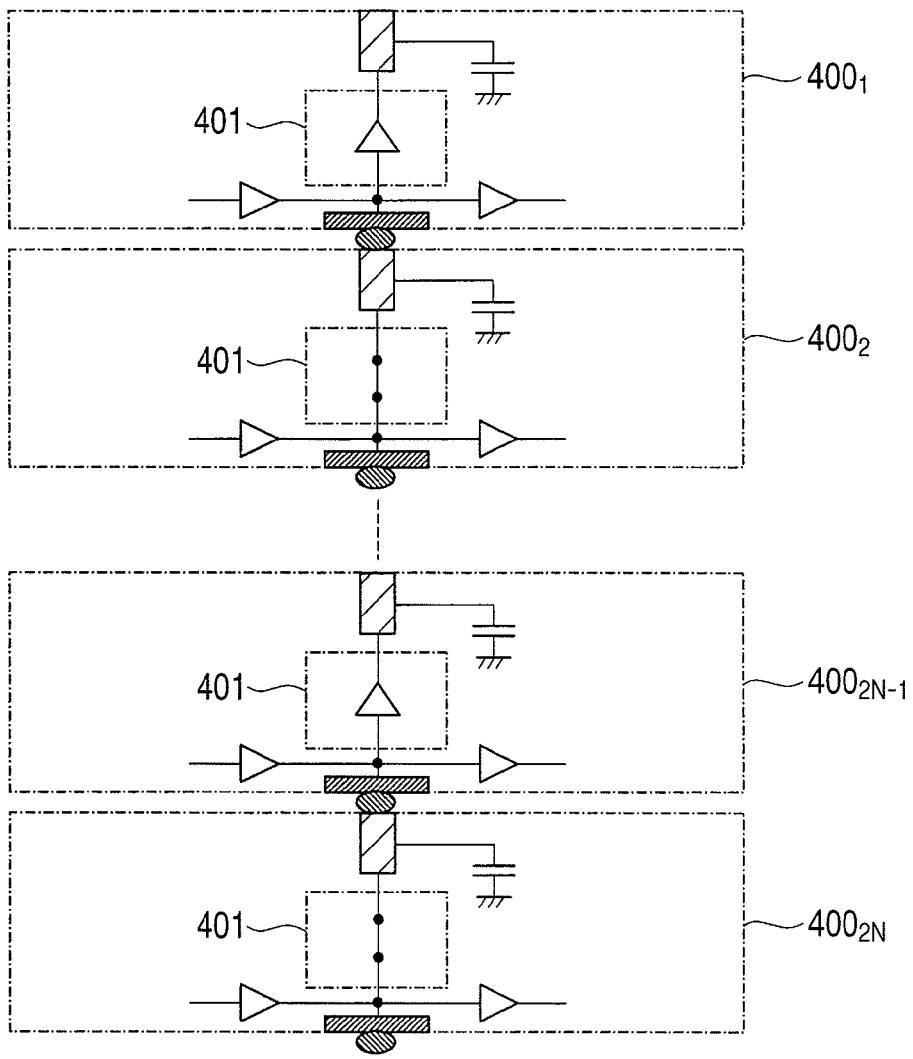
FIG. 4B is an equivalent circuit diagram showing a through-via-hole path when the semiconductor chips of FIG. 4A are mounted to stack.

FIG. 4A is an equivalent circuit diagram showing an outline constitution example of an essential portion per one semiconductor chip 400 in a semiconductor integrated circuit device according to a second embodiment of the invention, and FIG. 4B is an equivalent circuit diagram showing a through-via-hole path when the semiconductor chips 400 of FIG. 4A are mounted to stack. As shown by FIG. 4A, the semiconductor integrated circuit device of the second embodiment is essentially characterized in providing a unidirectional buffer circuit 402 which becomes a repeater circuit and providing a through bypass switch 403 connected in parallel between an input and an output of the buffer circuit 402 at a repeater circuit portion 401 attached with the switch of connecting the pad 102 and the penetrated conductor 101.

As described in first embodiment, by inserting the repeater circuits to all the semiconductor chips, a transmission frequency (that is, through put) of a signal is promoted. However, there is a concern of increasing delay time (that is, latency) of signal propagation in the path in accordance with the operation of the repeater circuit. Hence, a detour path is constituted by connecting a bypass switch which does not pass the repeater circuit in parallel therewith. When the bypass is used, although the via hole parasitic capacitance is added, an increase in delay time of an amount of passing the buffer circuit can be avoided. By trade-off of improving the throughput by reducing the parasitic capacitance and restraining the increase in the delay time, selection of the repeater circuit/bypassing through for each semiconductor chip in the through-via-hole path is determined.

For example, in an example of FIG. 4B, in a through-via-hole path constituted by even-number pieces of consecutive semiconductor chips $400_1, 400_2, \ldots, 400_{2N-1}, 400_{2N}$, a state in which unidirectional buffer circuits are selected at oddnumbered semiconductor chips $400_1$, $400_{2N-1}$, and through bypass switches are selected at even-numbered semiconductor chips $400_2$, $400_{2N}$ is shown. As a result, in the through-via-hole path connected vertically, the through bypasses and the repeater circuits are alternately inserted. In this case, parasitic capacitances of 2 pieces of through-via-holes are present among the repeater buffers, and therefore, an operational frequency becomes about a half in comparison with that of a case of fully inserting the repeater circuits. On the other hand, the increase in the delay time becomes a half in comparison with that of a case of fully inserting the repeater circuits. In an actual system, by trade-off of the frequency (throughput) of a signal to be transmitted and the delay time (latency) of the through-via-hole path, the chips are stacked by selecting a ratio of inserting the through bypasses and the repeater circuits. By the optimization, high speed communication can be realized among the semiconductor chips. Also in FIG. 4B, similar to the case of FIG. 3C, communication is conceived in a transmission direction from the semiconductor chip $400_{2N}$ at the lowest layer to the semiconductor chip $400_1$ at the highest layer.

As described above, by using the semiconductor integrated circuit device according to the second embodiment of the invention, representatively, high speed communication can be realized among the semiconductor chips.

Third Embodiment

Figure 5A:
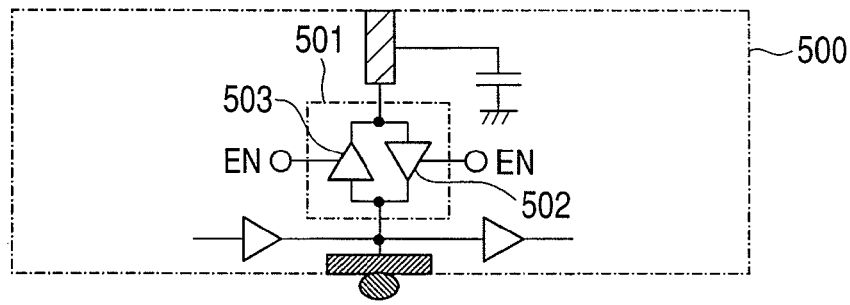
FIG. 5A is an equivalent circuit diagram of a semiconductor integrated circuit device according to a third embodiment of the invention showing an outline constitution example of an essential portion per one semiconductor chip.
Figure 5B:
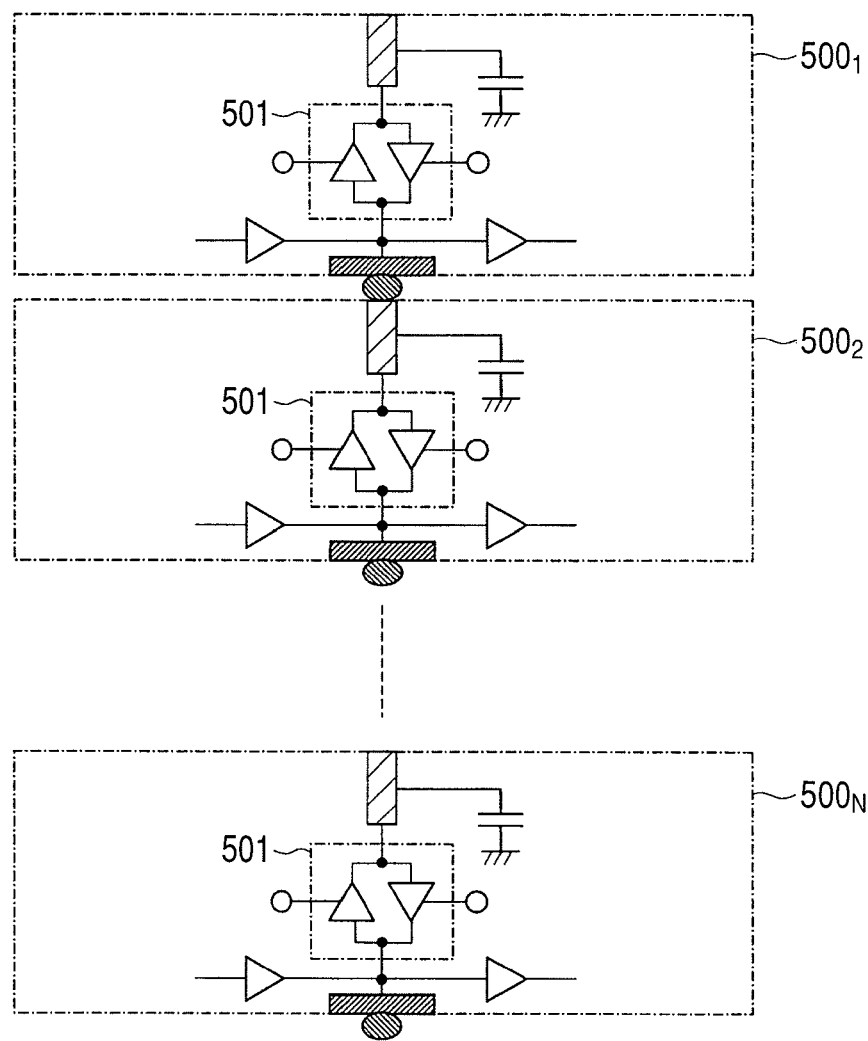
FIG. 5B is an equivalent circuit diagram showing a through-via-hole path when the semiconductor chips of FIG. 5A are mounted to stack.

FIG. 5A is an equivalent circuit diagram showing an outline constitution example of an essential portion per one semiconductor chip 500 in a semiconductor integrated circuit device according to a third embodiment of the invention, and FIG. 5B is an equivalent circuit diagram showing a through-via-hole path when the semiconductor chips 500 of FIG. 5A are mounted to stack. As shown by FIG. 5A, the semiconductor integrated circuit device of the third embodiment is essentially characterized in using bidirectional buffer circuits 502, 503 in which one input is connected to other output as a repeater circuit 501. The respective buffer circuits 502, 503 are constituted by tristate buffers outputs of which can be set to a high impedance state. Therefore, a transmission direction of a signal of the through-via-hole path can be selected by, for example, activating one of the buffer circuits 502, 503 and deactivating other such that output becomes a high impedance state.

Figure 6A:
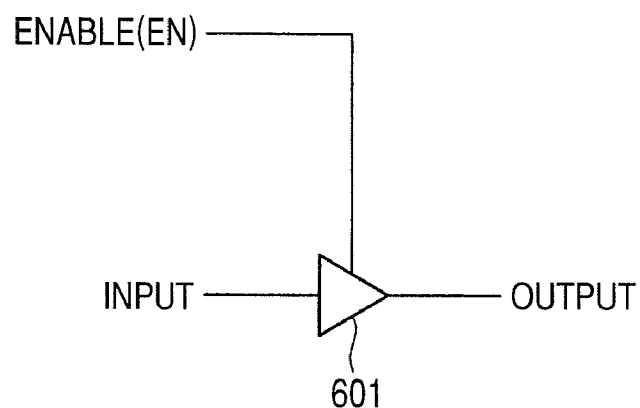
FIG. 6A shows symbols of a tristate buffer circuit of FIG. 5A.
Figure 6B:
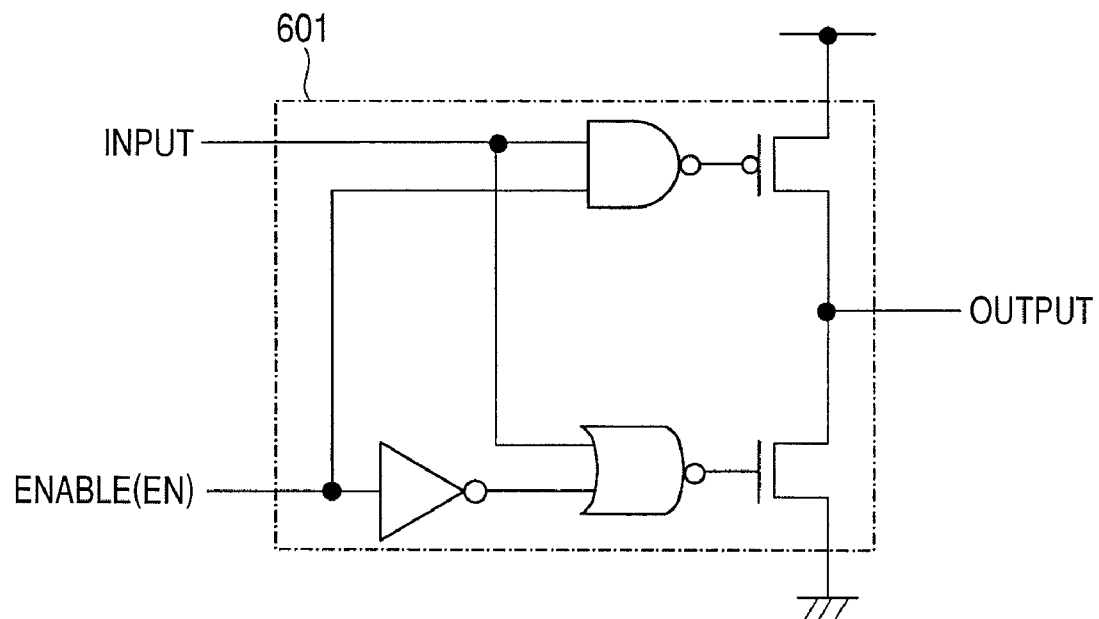
FIG. 6B is an equivalent circuit diagram showing a detailed constitution example of FIG. 6A.

FIG. 6A shows symbols of the tristate buffer circuit in FIG. 5A and FIG. 6B is an equivalent circuit diagram showing a detailed constitution example of FIG. 6A. As shown by FIG. 6B, a tristate buffer circuit 601 is operated as a buffer circuit when 'H' is inputted to enable terminal (EN) and when 'L' is inputted, two FETs at an output stage are simultaneously made OFF and an output terminal becomes a high impedance state. Further, in FIG. 5B, N pieces of semiconductor chips $500_1$ through $500_N$ are mounted to stack successively from the highest layer. In the respective semiconductor chips, as shown by FIG. 5A, by bidirectionally arranging 2 pieces of the tristate buffer circuits, communication in a transmission direction directed from the semiconductor chip $500_1$ to the semiconductor chips $500_N$ and a reverse transmission direction can be carried out. In that case, it is necessary to set the enable terminal (EN) of the tristate buffer circuit previously in accordance with the transmission direction. When bidirectional connection is assumedly carried out by an ordinary buffer circuit in place of the tristate buffer circuit, for example, when capacities of driving the respective buffer circuits stay the same over the all semiconductor chips, in principle, the bidirectional communication can be realized. However, actually, the drive capacity differs, and therefore, it is preferable to carry out communication after previously setting the transmission direction by using the tristate buffer circuit.

Figure 7:
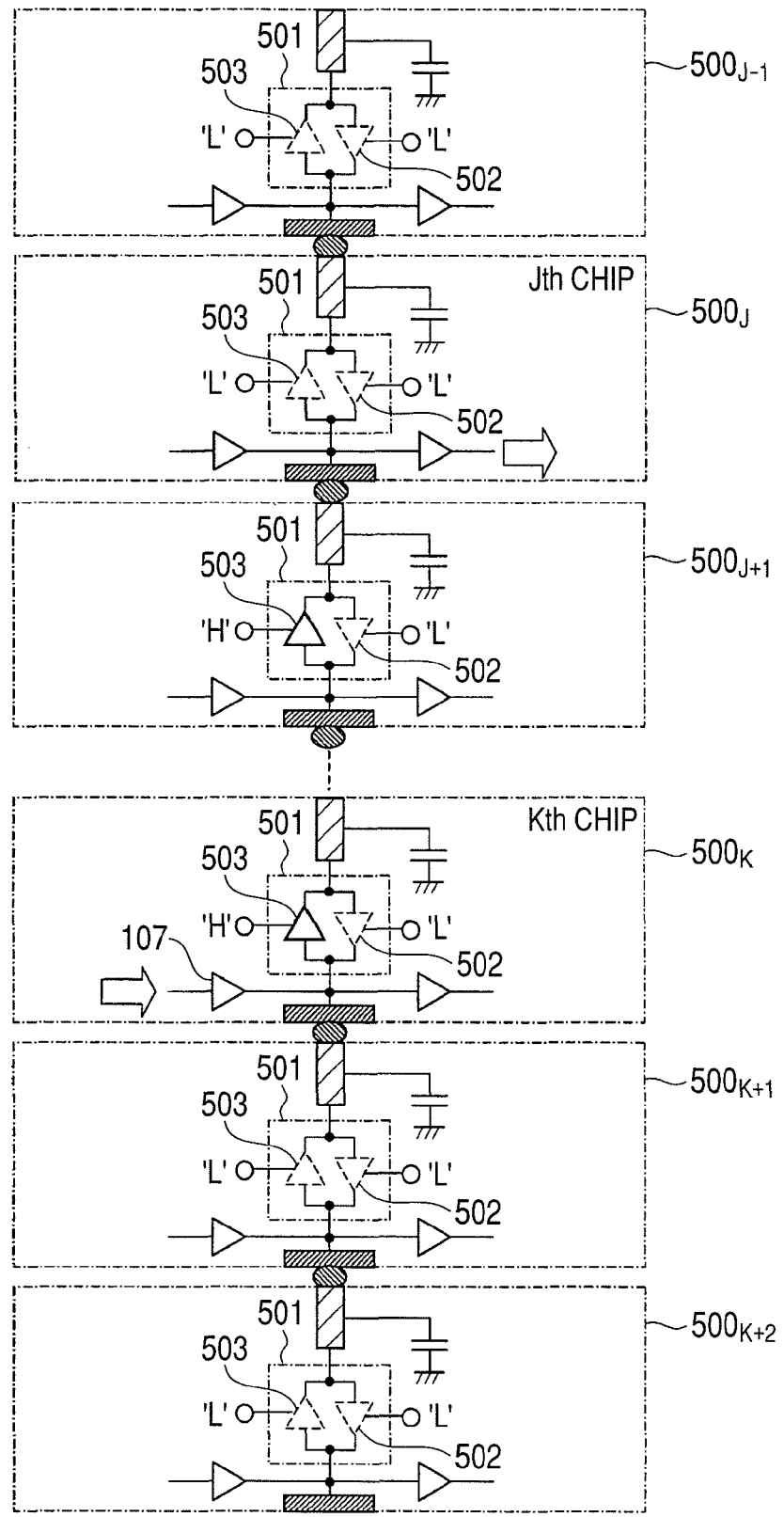
FIG. 7 is an explanatory view using the constitution example of FIG. 5B and showing a method of setting respective tristate buffer circuits thereof.

Further, not only controlling 2 pieces of tristate buffer circuits which become bidirectional complementarily in accordance with the transmission direction as described above, but, for example, the tristate buffer circuits can also be controlled such that outputs of the both becomes the high impedance state. FIG. 7 is an explanatory view showing an example of a setting method of the respective tristate buffer circuits by using the constitution example of FIG. 5B. In FIG. 7, semiconductor chips $500_{J-1}$, $500_J$, $500_{J+1}$, . . . , $500_K$, $500_{K+1}$, $500_{K+2}$ are mounted to stack from upper layers to lower layers. Between the semiconductor chip $500_{J+1}$ through semiconductor chip $500_K$, tristate buffer circuits 503 on one side in the repeater circuits 501 are activated (EN='H'), and tristate buffer circuits 502 on other side are deactivated (EN='L'), and communication in a transmission direction directed from the semiconductor chip $500_K$ to the semiconductor chip $500_J$ can be carried out. On the other hand, at semiconductor chips arranged at layers at and below the semiconductor chip $500_{K+1}$, and semiconductor chips arranged at layers at and above the semiconductor chip $500_J$, tristate buffer circuits 502, 503 on both sides in the repeater circuit 501 are deactivated (EN='L'). In FIG. 7, buffer circuits in high impedance in accordance with deactivation are indicated by dotted lines.

For example, in this way, when communication is intended to carry out from the semiconductor chip $500_K$ to the semiconductor chip $500_J$ in a certain period of time, it is not necessary to transmit a signal to a portion at and above the repeater circuit 501 of the semiconductor chip $500_J$. Hence, by making the repeater circuits 501 of the semiconductor chip $500_J$ and the semiconductor chip $500_{J-1}$ the high impedance state, unnecessary charging and discharging to the through-via-holes which are not used in transmission can be prevented, and wasteful power consumption consumed by the parasitic capacitance of the through-via-hole can be restrained. Further, it is not also necessary to transmit a signal also to a portion at and below the repeater circuit 501 of the semiconductor chip $500_{K+1}$, and therefore, by making the portion the high impedance state, similar to the above-described description, the wasteful power consumption can be restrained. Further, by making the portion at and below the repeater circuit 501 of the semiconductor chip $500_{K+1}$ the high impedance state, also an erroneous operation can be prevented. That is, even when the tristate buffer circuit 503 on one side in the repeater circuit 501 of the semiconductor chip $500_{K+1}$ is made assumedly to be in the activated state, signal transmission from the semiconductor chip $500_K$ can be cut. However, in this case, there is a concern that the output of the tristate buffer circuit 503 (since the input is indefinite, also the output is indefinite) effects an influence on the output from the output buffer circuit 107 of the semiconductor chip $500_K$ and an erroneous operation is caused, and therefore, it is preferable to set also the output of the tristate buffer circuit 503 to the high impedance state.

As described above, by using the semiconductor integrated circuit device according to the third embodiment of the invention, similar to the case of the first embodiment, representatively, high speed communication can be realized among the semiconductor chips. Further, in addition thereto, reduction of power consumption can be carried out. Further, the semiconductor integrated circuit device of the third embodiment can also be used by being combined with the semiconductor integrated circuit of the second embodiment described above.

That is, by making a portion of the through-via-hole path through bypass, promotion of latency may be achieved.

Fourth Embodiment

Figure 8A:
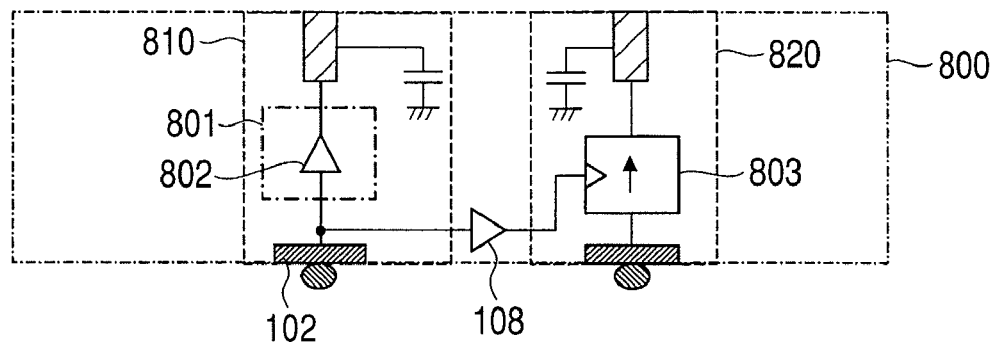
FIG. 8A is an equivalent circuit diagram of a semiconductor integrated circuit device according to a fourth embodiment of the invention showing an outline constitution example of an essential portion per one semiconductor chip.
Figure 8B:
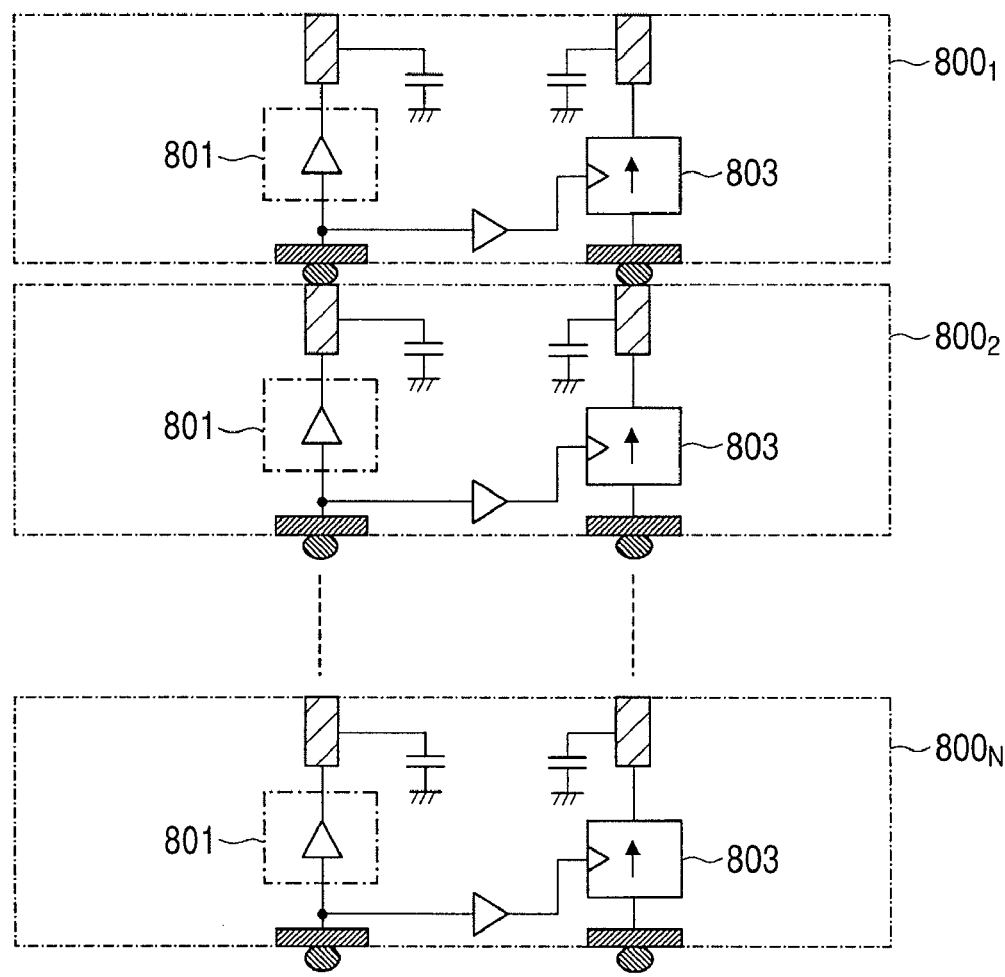
FIG. 8B is an equivalent circuit diagram showing a through-via-hole path when the semiconductor chips of FIG. 8A are mounted to stack.

FIG. 8A is an equivalent circuit diagram showing a semiconductor integrated circuit device according to a fourth embodiment of the invention showing an outline constitution example of an essential portion per one semiconductor chip 800 thereof, and FIG. 8B is an equivalent circuit diagram showing a through-via-hole path when the semiconductor chips 800 of FIG. 8A are mounted to stack. As shown by FIG. 8A, the semiconductor integrated circuit device of the fourth embodiment is essentially characterized in using both of a through-via-hole path 820 including a latch circuit 803, and a through-via-hole path 810 including a repeater circuit 801.

In FIG. 8A, a clock signal is transmitted in the through-via-hole path 810, and a data signal is transmitted in the through-via-hole path 820. The repeater circuit 801 in the through-via-hole path 810 is constituted by a unidirectional buffer circuit 802. The latch circuit 803 in the through-via-hole path 820 carries out a latch operation by using the clock signal transmitted from the pad 102 of the through-via-hole path 810 via the input buffer circuit 108. In FIG. 8B, N pieces of semiconductor chips $800_1$ through $800_N$ are stacked from the highest layer to the lowest layer by using the semiconductor chips 800 of FIG. 8A. Here, communication in a transmission direction directed from the semiconductor chip $800_N$ of the lowest layer to the semiconductor chip $800_1$ of the highest layer is conceived.

When such a constitution is used, parasitic capacitances of the respective through-via-hole paths are isolated for the respective semiconductor chips by the repeater circuits 801 of the clock signal path (through-via-hole path 810) and the latch circuits 803 of the data signal path (through-via-hole path 820), and therefore, transmission frequencies of the two signals can be promoted. That is, in comparison with the technology of JP-A-2006-330974, frequencies of not only the data signal but the clock signal can be increased, and therefore, the throughput can be increased. Further, the semiconductor integrated circuit device of the fourth embodiment can be used by being combined with the semiconductor integrated circuit device of the second embodiment or the third embodiment described above. That is, the repeater circuit at a midway of the through-via-hole path can be made to be the high impedance state or through bypass. Or by inserting the tristate buffer circuit at the output stage of the latch circuit 803 and setting the tristate buffer circuit to the high impedance state, wasteful transmission of the signal, that is, consumption of power can also be prevented.

As described above, by using the semiconductor integrated circuit device according to the fourth embodiment of the invention, representatively, high speed communication can be realized among the semiconductor chips.

Fifth Embodiment

Figure 12A:
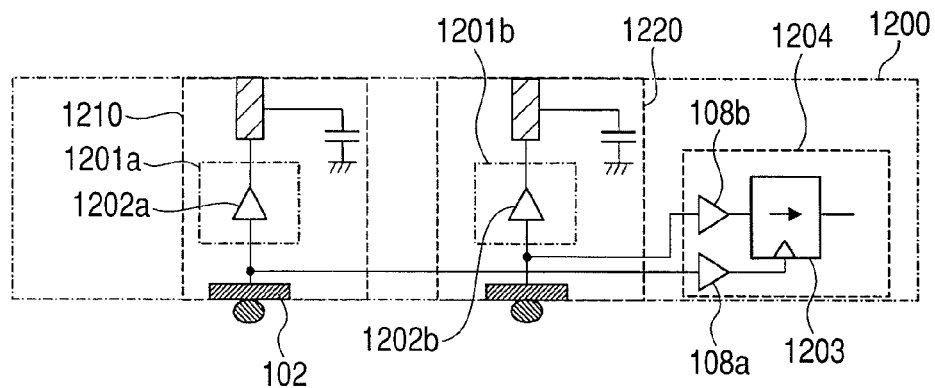
FIG. 12A is an equivalent circuit diagram of a semiconductor integrated circuit device according to a fifth embodiment of the invention showing an outline constitution example of an essential portion per one semiconductor chip.
Figure 12B:
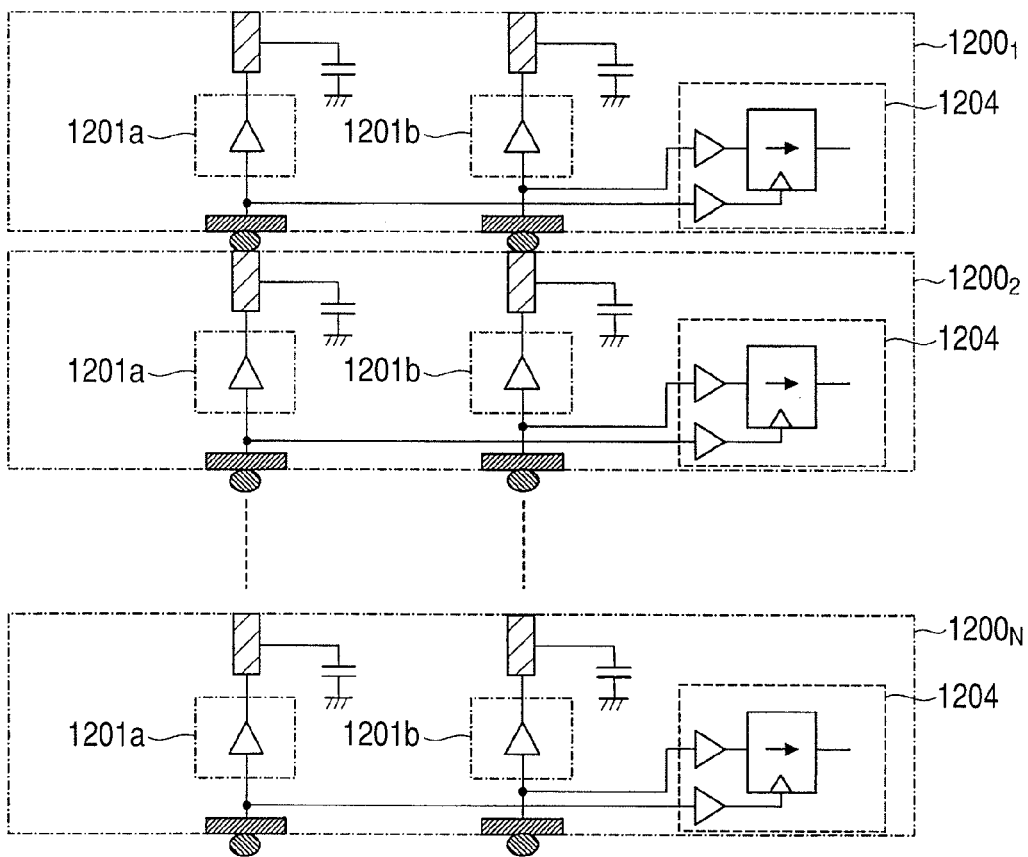
FIG. 12B is an equivalent circuit diagram showing a through-via-hole path when the semiconductor chips of FIG. 12A are mounted to stack.

FIG. 12A is an equivalent circuit diagram of a semiconductor integrated circuit device according to a fifth embodiment of the invention showing an outline constitution example of an essential portion per one semiconductor chip 1200 thereof, and FIG. 12B is an equivalent circuit diagram showing a through-via-hole path when the semiconductor chips 1200 of FIG. 12A are mounted to stack. Different from the semiconductor integrated circuit device of the fourth embodiment described above, the semiconductor integrated circuit device of the fifth embodiment is essentially characterized in transmitting the clock signal and the data signal respectively via through-via-hole paths including the repeater circuits.

In FIG. 12A, the clock signal is transmitted in a through-via-hole path 1210, and the data signal is transmitted in a through-via-hole path 1220. A repeater circuit 1201*a* in the through-via-hole path 1210 is constituted by a unidirectional buffer circuit 1202*a*, and also a repeater circuit 1201*b* in the through-via-hole path 1220 is constituted by a unidirectional buffer circuit 1202*b*. The clock signal and the data signal inputted from the respective pads 102 of the through-via-hole paths 1210, 1220 are inputted to an inner input interface circuit 1204 of the semiconductor chip 1200. The inner input interface circuit 1204 transmits the inputted clock signal and the inputted data signal respectively to a latch circuit 1203 via respective buffer circuits 108*a*, 108*b*, and the latch circuit 1203 latches the data signal by using the clock signal to transmit to a predetermined inner core circuit. In FIG. 12B, N pieces of semiconductor chips $1200_1$ through $1200_N$ are stacked from the highest layer to the lowest layer by using the semiconductor chips 1200 of FIG. 12A. Here, communication in a transmission direction directed from the semiconductor chip $1200_N$ of the lowest layer to the semiconductor chip $1200_1$ of the highest layer is conceived.

When such a constitution is used, by the repeater circuits 1201*a* of the clock signal path (through-via-hole path 1210) and the repeater circuits 1201*b* of the data signal path (through-via-hole path 1220), parasitic capacitances of the respective through-via-hole paths are isolated for the respective semiconductor chips, and therefore, transmission frequencies of the two signals can be increased. Further, although in constitution examples of FIG. 8A, FIG. 8B described above, delay time (latency) of the data signal from when an instruction is issued to when a response is returned is clock period×stack number, by using constitution examples of FIG. 12A, FIG. 12B, the latency can be made to be less than one time clock period. Thereby, promotion of the throughput and the latency can be achieved.

As described above, by using the semiconductor integrated circuit device according to the fifth embodiment of the invention, representatively, high speed communication can be realized among the semiconductor chips. Further, the semiconductor integrated circuit device of the fifth embodiment can also be used by being combined with the semiconductor integrated circuit device of the second embodiment or the third embodiment described above. That is, the repeater circuit at a midway of the through-via-hole path can be made to be the high impedance state, or through bypass.

Sixth Embodiment

Figure 9A:
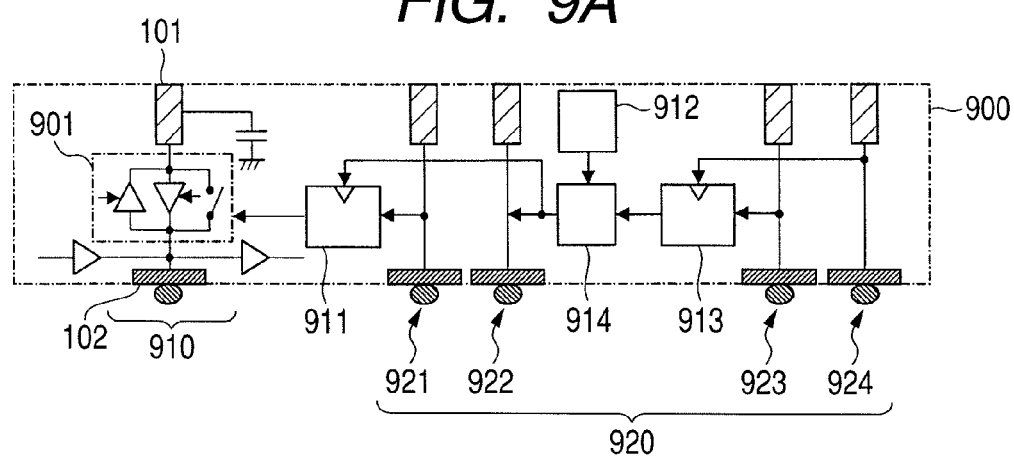
FIG. 9A is an equivalent circuit diagram of a semiconductor integrated circuit device according to a sixth embodiment of the invention showing an outline constitution example of an essential portion per one semiconductor chip.
Figure 9B:
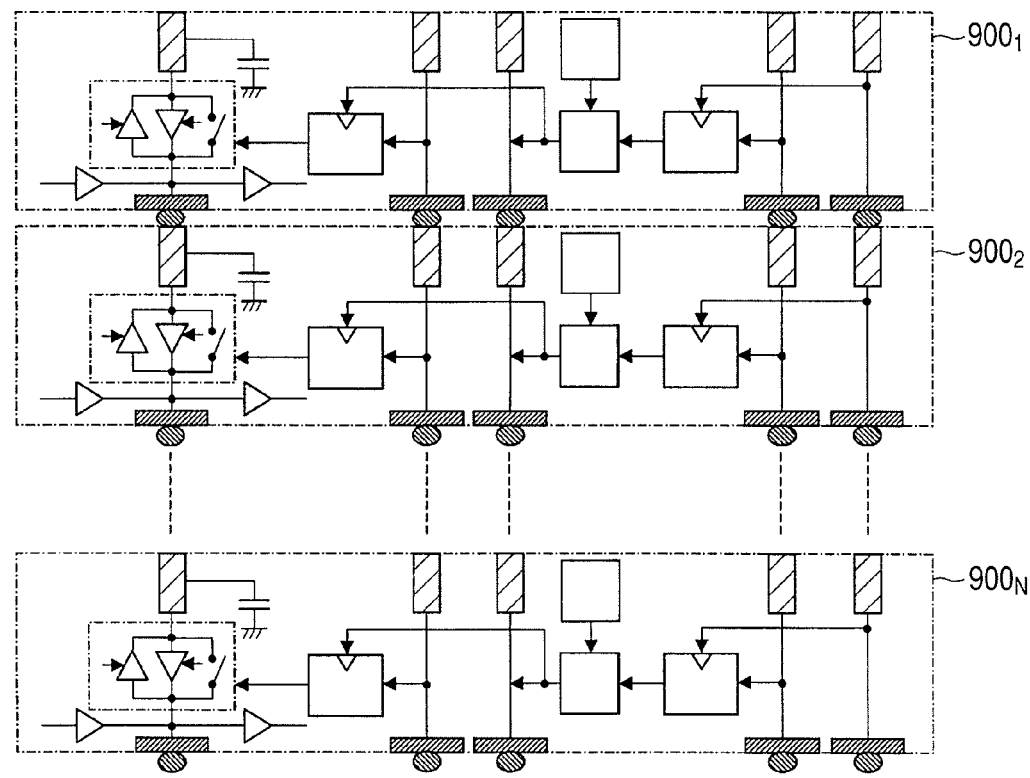
FIG. 9B is an equivalent circuit diagram showing a through-via-hole path when the semiconductor chips of FIG. 9A are mounted to stack.

FIG. 9A is an equivalent circuit diagram of a semiconductor integrated circuit device according to a sixth embodiment of the invention showing an outline constitution example of an essential portion per one semiconductor chip, and FIG. 9B is an equivalent circuit diagram showing a through-via-hole path when the semiconductor chips of FIG. 9A are mounted to stack. The semiconductor integrated circuit device of the sixth embodiment shows a mechanism of selecting functions of the repeater circuits of the respective semiconductor chips described above by using an external signal.

As shown by FIG. 9A, a semiconductor chip 900 is constituted by a high speed through-via-hole path 910 for transmitting a high speed signal, a low speed through-via-hole path 920 for transmitting a control signal, and a number of setting circuits. The high speed through-via-hole path 910 is constituted by the pad 102, the penetrated conductor 101, and a repeater circuit portion 901 attached with a switch for connecting these. The switch-attached repeater circuit portion 901 is constructed by a constitution in which two pieces of tristate buffer circuits which become bidirectional shown in third embodiment, and a through pass switch shown in the second embodiment are connected in parallel with each other. By inputting a control signal to the respective tristate buffer circuits and the switch, upper direction transmission, lower direction transmission, cut of the signal and through bypass not by way of buffer can be selected.

On the other hand, in the low speed through-via-hole path 920 of the latter, the pad 102 and the penetrated conductor 101 are directly connected, and is constructed by a constitution of electrically penetrating all of the stacked chips similar to the background art. In the semiconductor chip 900 of FIG. 9A, 4 pieces of through-via-hole paths 921 through 924 are provided as the low speed through-via-hole path 920 and the setting circuit for setting the switch-attached repeater circuit portion 901 carries out an operation by using signals of the through-via-hole paths. The setting circuit is constituted by a control register circuit 911 for designating the function of the high speed through-via-hole path 910, an ID forming circuit 912 for forming a chip inherent ID, an ID register circuit 913 for preserving a chip designating ID inputted via the through via hole path 923, and a comparing circuit 914 for comparing the chip inherent ID and the chip designating ID. Further, in FIG. 9B, N pieces of semiconductor chips $900_1$ through $900_N$ are stacked from the highest layer to the lowest layer by using the semiconductor chips 900 of FIG. 9A.

Next, detailed operation examples of constitution examples of FIG. 9A and FIG. 9B will be explained. Here, as an example, a case of setting the semiconductor chip $900_2$ is conceived. First, a chip designating ID coinciding with a chip inherent ID of the semiconductor chip $900_2$ is transmitted by using the through-via-hole path 923. Thereby, the chip designating ID is stored to the ID register circuits 913 of all of the semiconductor chips $900_1$ through $900_N$. Here, when a trigger signal is inputted by using the through-via-hole path 924, the comparing circuits 914 of the respective semiconductor chips $900_1$ through $900_N$ compare chip inherent IDs and the stored chip designating ID. At a coinciding semiconductor chip (here, semiconductor chip $900_2$), the comparing circuit 914 starts the control register circuit 911, and the control register circuit 911 latches a selected signal of a through-via-hole function inputted via the through-via-hole path 921 to set the switch-attached repeater circuit portion 901. By a similar method, the switch-attached repeater circuit portions 901 of the semiconductor chips $900_1$ through $900_N$ are set, and the function of the high speed through-via-hole path 910 is set. Further, the through-via-hole path 922 is used for a source of issuing setting to recognize that setting is carried out to any of the semiconductor chips $900_1$ through $900_N$ by a coinciding signal from the comparing circuit 914.

An advantage of the constitution example resides in that, first, design and fabrication cost of mask layout or the like can be reduced since a circuit constitution at a surrounding of the through-via-hole can stay the same without depending on numbers of stacked chips. Further, the function of the through-via-hole path can be changed dynamically by sending the control signal during the operation, and therefore, more flexible stacked chip system can be constructed. Although in sixth embodiment, the control signal is assumed to be at low speed, and paths conducting all of the through-via-holes electrically are used, the invention is not limited thereto. For example, by inserting repeater circuits composed of unidirectional buffer circuits to the through-via-hole paths 921 through 924 of FIG. 9A, FIG. 9B as in the first embodiment described above, the function of the high speed through-via-hole path 910 can also be selected at a faster speed.

As described above, by using the semiconductor integrated circuit device according to the sixth embodiment of the invention, representatively, high speed communication can be realized among semiconductor chips. Further, the function of the through-via-hole path can pertinently be changed and an optimum communication path can be constructed in accordance with an application or the like realized by the semiconductor integrated circuit device.

Seventh Embodiment

Figure 10A:
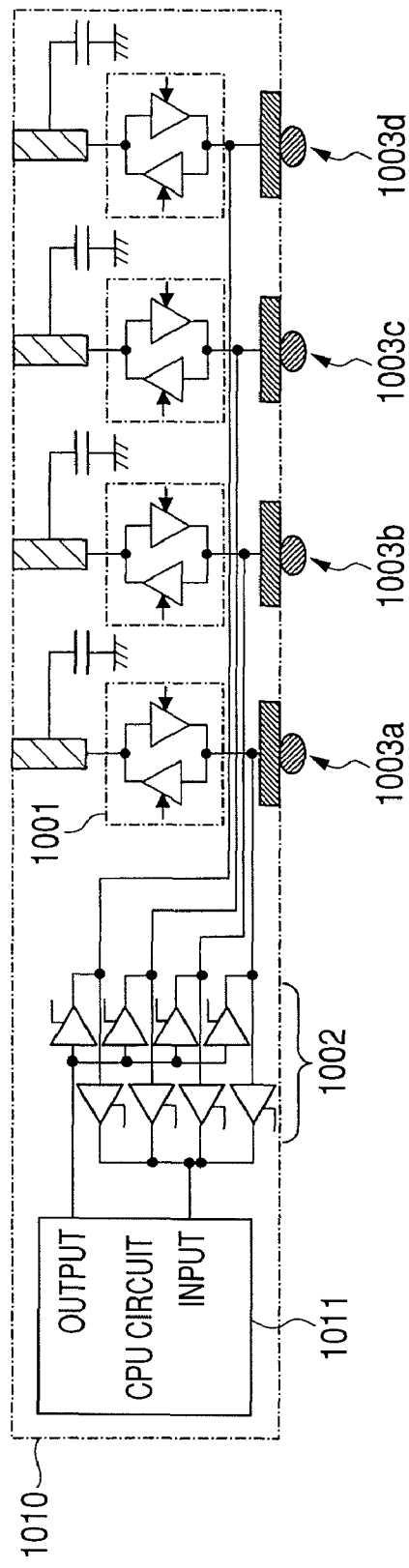
FIG. 10A is an equivalent circuit diagram of a semiconductor integrated circuit device according to a seventh embodiment of the invention showing an outline constitution example of an essential portion of a CPU chip which becomes one semiconductor chip.
Figure 10B:
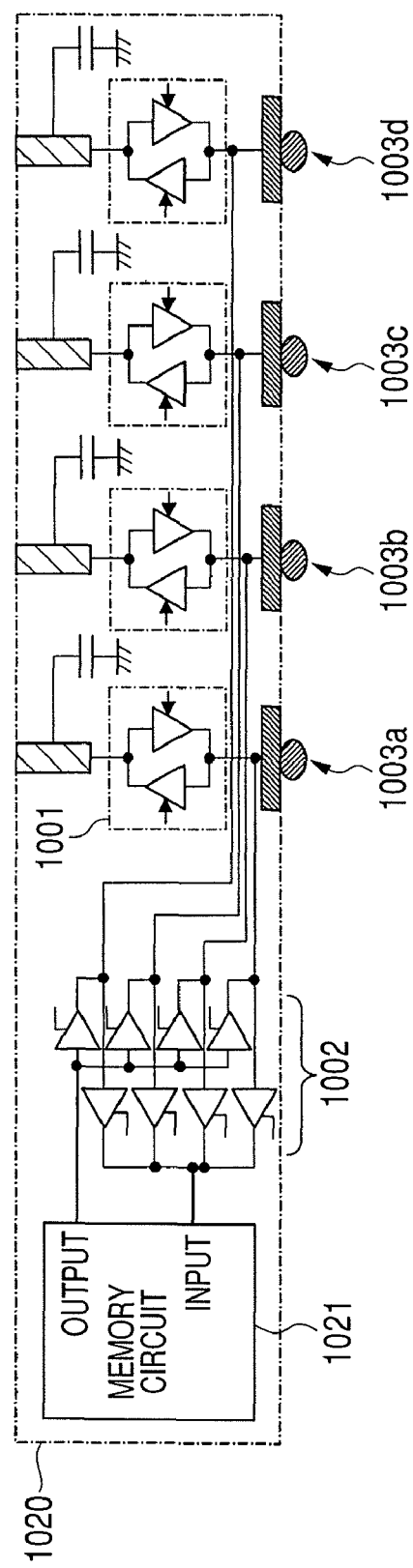
FIG. 10B is an equivalent circuit diagram showing an outline constitution example of an essential portion of a memory chip which becomes another semiconductor chip.

FIG. 10A is an equivalent circuit diagram of a semiconductor integrated circuit device according to a seventh embodiment of the invention showing an outline constitution example of an essential portion of a CPU chip 1010 which becomes one semiconductor chip thereof, and FIG. 10B is an equivalent circuit diagram of a semiconductor integrated circuit device according to the seventh embodiment of the invention showing an outline constitution example of an essential portion of a memory chip 1020 which becomes one semiconductor chip thereof. The CPU chip 1010 includes a CPU circuit 1011 for carrying out a predetermined operating processing, and an input/output interface circuit group 1002 bearing an interface of outside of chip and the CPU circuit 1011. The memory chip 1020 includes a memory circuit 1021 for holding input data and outputting held data, and the input/output interface circuit group 1002 bearing an interface of outside of chip and the memory circuit 1021.

The CPU chip 1010 and the memory chip 1020 each includes a plurality (here, 4 pieces) of through-via-hole paths 1003a through 1003d which become transmitting and receiving paths to and from outside of the chip. Each of through-via-hole paths 1003a through 1003d includes two pieces of tristate buffer circuits which become bidirectional as a repeater circuit 1001. Further, the input/output interface circuit group 1002 is constituted by, for example, a plurality (here, 8 pieces) of tristate buffer circuits. By setting the tristate buffer circuits, one output of the CPU circuit 1011 is made to be able to be connected to any one of the through-via-hole paths 1003a through 1003d, and also one input of the CPU circuit 1011 is made to be able to be connected to any one of the through-via-hole paths 1003a through 1003d. Similarly, one output of the memory circuit 1021 is made to be able to be connected to any one of the through-via-hole paths 1003a through 1003d, and also one input of the memory circuit 1021 is made to be able to be connected to any one of the through-via-hole paths 1003a through 1003d.

Further, here, although each of the CPU circuit 1011 and the memory circuit 1021 includes one input and one output and a constitution of including 4 pieces of the through-via-hole paths is constructed, actually, there are inputs and outputs of numbers in accordance with bit numbers of data lines and address lines etc., and numbers of the through-via-hole paths in accordance therewith are provided. Further, the respective repeater circuits 1001 included in the CPU chip 1010 and the memory chip 1020 are set with transmission directions and presence/absence of cut by, for example, a control method shown in the fifth embodiment in starting the operation. In addition, also the respective tristate buffer circuits in the input/output interface circuit group 1002 are set to an activated state or deactivated state similar to the control method shown, for example, in fifth embodiment.

Figure 11:
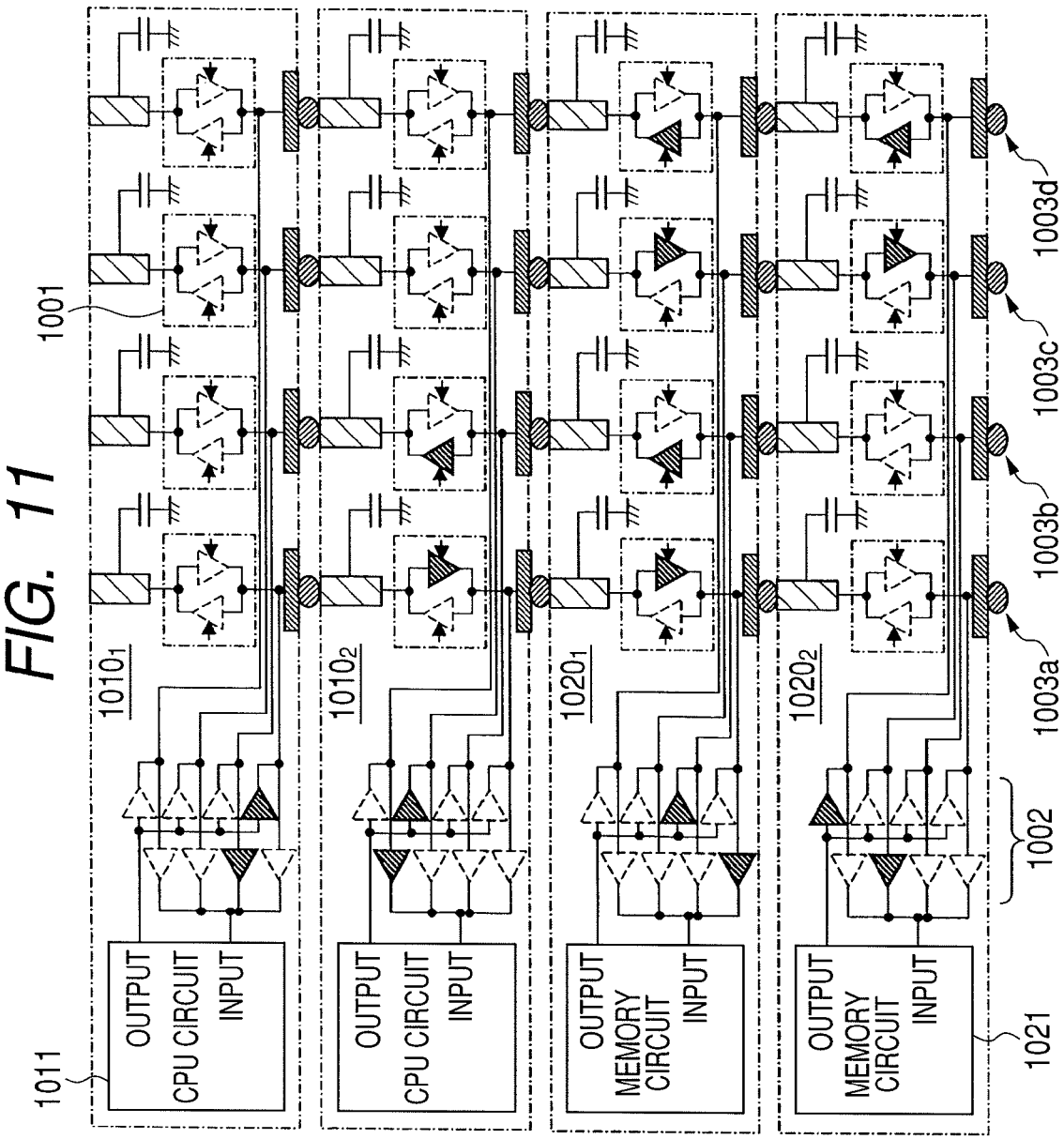
FIG. 11 is an equivalent circuit diagram showing an example of a semiconductor integrated circuit device constituted by stacking the semiconductor chips of FIG. 10A and FIG. 10B.

FIG. 11 is an equivalent circuit diagram showing an example of a semiconductor integrated circuit device constituted by stacking the semiconductor chips of FIG. 10A and FIG. 10B. In FIG. 11, 2 sheets of CPU chips $1010_1$, $1010_2$ are successively stacked from an upper layer to a lower layer, further, 2 sheets of the memory chips $1020_1$, $1020_2$ are successively stacked toward lower layers thereof. Here, a case in which the CPU chip $1010_1$ communicates with the memory chip $1020_1$, and in parallel therewith, the CPU chip $1010_2$ communicates with the memory chip $1020_2$ is conceived by the through-via-hole paths 1003a through 1003d.

In this case, for example, various settings are carried out such that the output of the CPU circuit 1011 of the CPU chip $1010_1$ is connected to the input of the memory chip $1020_1$ via the through-via-hole path 1003a, and the input of the CPU circuit 1011 of the CPU chip $1010_1$ is connected to the output of the memory chip $1020_1$ via the through-via-hole path 1003b. Further, various settings are carried out such that the output of the CPU circuit 1011 of the CPU chip $1010_2$ is connected to the input of the memory chip $1020_2$ via the through-via-hole path 1003c, and the input of the CPU circuit 1011 of the CPU chip $1010_2$ is connected to the output of the memory chip $1020_2$ via the through-via-hole path 1003d.

Specifically, as shown by FIG. 11, respective tristate buffer circuits indicated by bold lines are set to an activated state, and respective tristate buffer circuits indicated by dotted lines are set to a deactivated state. Explaining representatively of a communication path of the CPU chip $1010_1$ and the memory chip $1020_1$, first, in the input/output interface circuit groups 1002 of the CPU chip $1010_1$ and the memory chip $1020_1$, as described above, setting of pertinently connecting to the respective through-via-hole paths 1003a, 1003b and cutting the other through-via-hole paths 1003c, 1003d is carried out. Further, at the through-via-hole path 1003a, the repeater circuits 1001 of the CPU chip $1010_2$ and the memory chip $1020_1$ are set in a downward transmission direction, and at the through-via-hole path 1003b, the repeater circuits 1001 of the CPU chip $1010_2$ and the memory chip $1020_1$ are set in an upward transmission direction. Further, in order to realize a reduction in power consumption and prevention of an erroneous operation as described in third embodiment, the other repeater circuits 1001 of the through-via-hole paths 1003a, 1003b are set to a high impedance state. Here, the CPU chip $1010_2$ disposed between the CPU chip $1010_1$ and the memory chip $1020_1$ do not effect influences to each other since connection with the through-via-hole paths 1003a, 1003b is cut by the input/output interface circuit groups 1002.

A communication path of the CPU chip $1010_2$ and the memory chip $1020_2$ is constructed similar to various settings accompanied by a communication path of the CPU chip $1010_1$ and the memory chip $1020_1$. Thereby, the communication path of the CPU chip $1010_1$ and the memory chip $1020_1$ and the communication path of the CPU chip $1010_2$ and the memory chip $1020_2$ can be constructed independently from each other so that influences are not effected to the respective communication paths, and a high performance multiprocessor system can be realized by parallel operation of the respective communication paths. Further, in FIG. 11, circuit constitutions at surroundings of the through-via-hole paths (repeater circuits and input/output interface circuit groups) and layout constitutions thereof can be fixed without depending on stacking positions and kinds of chips (CPU chip or memory chip), and therefore, also a product design can be realized to be easy.

Further, in FIG. 11, when, for example, a structure of alternately stacking the CPU chips and the memory chips is constituted, a multiprocessor system can be realized by a smaller number of pieces of through-via-hole paths. However, from a view point of, for example, heat radiating performance or the like, it is preferable to deviatedly stack the CPU chips and the memory chips as in FIG. 11, in this case, it is conceived that a communication distance between the CPU chip and the memory chip is prolonged, and therefore, it is useful to use the constitution example as in FIG. 11.

As described above, by using the semiconductor integrated circuit device according to the seventh embodiment of the invention, similar to the case of first embodiment, representatively, high speed communication can be realized between semiconductor chips, in addition, similar to third embodiment, also a reduction in power consumption can be carried out. Further, after providing the effects, the high performance multiprocessor system can be realized. Further, although in seventh embodiment, a constitution of stacking 2 pieces of the CPU chips and 2 pieces of the memory chips is shown, a number of stacking can further be increased by increasing numbers of the through-via-hole paths and the tristate buffer circuits in the input/output interface circuit groups. Further, the respective tristate buffer circuits in the input/output interface circuit groups may be substituted for by, for example, CMOS switches or the like. Furthermore, the semiconductor integrated circuit device of the seventh embodiment can be used by being combined with the semiconductor integrated circuit device of the second embodiment described above. That is, by making a portion of the through-via-hole path through bypass, promotion of latency may be achieved.

Outline constitutions of essential portions as well as main advantages of respective embodiments explained above are briefly summarized as follows.

In the through-via-hole path connected vertically, by inserting the repeater circuits to the respective semiconductor chips and isolating parasitic capacitances parasitic on the through-via-holes for the respective chips, high speed transmission of signals can be carried out and wasteful power consumption at the through-via-holes can be restrained. The repeater circuit is the impedance converting circuit, and the output impedance of the buffer circuit does not depend on the impedance of the circuit connected to the input side. Therefore, by inserting the repeater circuits to the respective chips in the through-via-hole paths connected vertically, the through-via-hole parasitic capacitances can be isolated for the respective chips.

On the other hand, when the repeater circuits are inserted to all of the semiconductor chips, there is a concern of increasing delay time of signal propagation at the through-via-hole path. Hence, a detour path is constituted by connecting in parallel with the bypass switch which does not pass the repeater circuit. Although when the bypass is used, the via hole parasitic capacitance is added, the increase in the delay time of the amount for passing the buffer circuit can be avoided. A trade-off of the improvement of the throughput by the reduction in the parasitic capacitance and restraining an increase in the delay time, selection of the repeater circuit/through bypass for the respective chips of the through-via-hole path is determined.

Further, by making an output state of a certain repeater circuit the path high impedance, the signal is not transmitted to the through-via-hole thereafter. Therefore, wasteful power consumption at the through-via-hole which does not need signal transmission can be restrained. Finally, by enabling to select functions of the through-via-hole path (upward direction repeater buffer, downward direction repeater buffer, through bypass and high impedance state) by the external signal, the functions of the through-via-hole path can be changed after stacking semiconductor chips or in operating the stacked chip system. Thereby, in addition to that the optimum communication path can be constructed (that is, promotion of flexibility can be achieved) for the respective systems, the design with regard to the interface portion at the surrounding of the through-via-hole and a mask therefor can be made to stay the same in all of the semiconductor chips, and therefore, development cost can be reduced.

Although a specific explanation has been given of the invention which is carried out by the inventors based on the embodiments as described above, the invention is not limited to the embodiments but can variously be changed within the range not deviated from the gist.

The semiconductor integrated circuit device of the embodiments is a technology in which plural semiconductor chips are mounted to stack and which is useful by being applied to semiconductor products respectively connected by through-via-holes.

What is claimed is:

1. A semiconductor integrated circuit device comprising a plurality of semiconductor chips mounted to stack for transmitting a signal between the semiconductor chips per se and the semiconductor chips other than the semiconductor chips per se by a through-via-hole path;
   wherein each of the plurality of semiconductor chips includes:
   a first node disposed in the through-via-hole path and formed at a circuit forming face;
   a second node disposed in the through-via-hole path and formed at a semiconductor substrate face opposed to the circuit forming face; and
   a buffer circuit inserted between the first node and the second node for isolating an impedance of the first node and an impedance of the second node.

2. The semiconductor integrated circuit device according to claim 1, wherein the signal transmitted by the through-via-hole path is a clock signal.

3. The semiconductor integrated circuit device according to claim 1, wherein the signal transmitted by the through-via-hole path is a data signal.

4. The semiconductor integrated circuit device according to claim 1, further comprising:
   a first through-via-hole path and a second through-via-hole path constituting the through-via-hole paths,
   wherein the signal transmitted by the first through-via-hole path is a clock signal, and
   wherein the signal transmitted by the second through-via-hole path is a data signal.

5. The semiconductor integrated circuit device according to claim 1, wherein the buffer circuit is a unidirectional buffer circuit constituting an input by the first node and constituting an output by the second node, or constituting the input by the second node and constituting the output by the first node.

6. The semiconductor integrated circuit device according to claim 5, wherein the unidirectional buffer circuit is a tristate buffer circuit capable of setting the output to a high impedance state.

7. The semiconductor integrated circuit device according to claim 1, wherein the buffer circuit is a bidirectional buffer circuit composed of a first buffer circuit constituting an input by the first node and constituting an output by the second node and a second buffer circuit constituting the input by the second node and constituting the output by the first node.

8. The semiconductor integrated circuit device according to claim 7, wherein the first buffer circuit and the second buffer circuit are tristate buffer circuits capable of setting the output to a high impedance state.

9. The semiconductor integrated circuit device according to claim 1, wherein each of the plurality of semiconductor chips further includes:
   an inner core circuit for carrying out a predetermined processing; and
   an input buffer circuit and/or an output buffer circuit for connecting the first node and the inner core circuit.

10. The semiconductor integrated circuit device according to claim 1, wherein each of the plurality of semiconductor chips further includes:
    an inner core circuit for carrying out a predetermined processing; and
    an input buffer circuit or an output buffer circuit for connecting the second node and the inner core circuit.

11. A semiconductor integrated circuit device comprising:
    a plurality of semiconductor chips mounted to stack for transmitting a signal between the semiconductor chips per se and the semiconductor chips other than the semiconductor chips per se by a through-via-hole path;
    wherein each of the plurality of semiconductor chips includes:
    a first node disposed in the through-via-hole path and formed at a circuit forming face;
    a second node disposed in the through-via-hole path and formed at a semiconductor substrate face opposed to the circuit forming face;
    a buffer circuit inserted between the first node and the second node for isolating an impedance of the first node and an impedance of the second node; and
    a switch circuit inserted between the first node and the second node for connecting the first node and the second node when the switch circuit is driven to ON.

12. The semiconductor integrated circuit device according to claim 11, wherein the buffer circuit is a unidirectional buffer circuit constituting an input by the first node and constituting an output by the second node, or constituting the input by the second node and constituting the output by the first node.

13. The semiconductor integrated circuit device according to claim 12, wherein the unidirectional buffer circuit is a tristate buffer circuit capable of setting the output to a high impedance state.

14. The semiconductor integrated circuit device according to claim 11, wherein the buffer circuit is a bidirectional buffer circuit composed of a first buffer circuit constituting an input by the first node and constituting an output by the second node and a second buffer circuit constituting the input by the second node and constituting the output by the first node.

15. The semiconductor integrated circuit device according to claim 14, wherein the first buffer circuit and the second buffer circuit are tristate buffer circuits capable of setting the output to a high impedance state.

16. A semiconductor integrated circuit device comprising:
    a plurality of semiconductor chips mounted to stack for transmitting a signal between the semiconductor chips per se and the semiconductor chips other than the semiconductor chips per se by a through-via-hole path;
    wherein each of the plurality of semiconductor chips includes:
    a first node disposed in the through-via-hole path and formed at a circuit forming face;
    a second node disposed in the through-via-hole path and formed at a semiconductor substrate face opposed to the circuit forming face;
    a first tristate buffer circuit constituting an input by the first node and constituting an output by the second node, isolating an impedance of the first node and an impedance of the second node, and capable of setting the output to a high impedance state by constituting a deactivated state;

a second tristate buffer circuit constituting the input by the second node and constituting the output by the first node, isolating the impedance of the first node and the impedance of the second node, and capable of setting the output to the high impedance state by constituting the deactivated state; and a memory portion holding a piece of information of setting the first and the second tristate buffer circuits respectively to an activated state or the deactivated state and capable of arbitrarily rewriting the setting information.

17. The semiconductor integrated circuit device according to claim 16, wherein each of the plurality of semiconductor chips further includes a switch circuit of connecting the first node and the second when the switch circuit is driven to ON; and wherein the memory portion further holds a piece of information of making the switch circuit ON or OFF as the setting information.

18. The semiconductor integrated circuit device according to claim 16, wherein each of the plurality of semiconductor chips includes the through-via-hole path for setting and constituted to input the setting information transmitted via the through-via-hole path for setting to hold at the memory portion.

* * * * *